United States Patent
Shyu et al.

(10) Patent No.: US 7,652,776 B2
(45) Date of Patent: Jan. 26, 2010

(54) STRUCTURE AND METHOD FOR OVERLAY MEASUREMENT

(75) Inventors: Deh-Ming Shyu, Miaoli County (TW); Yi-Sha Ku, Hsinchu (TW)

(73) Assignee: Industrial Technology Research Institute, Hsin-Chu (TW)

( * ) Notice: Subject to any disclaimer, the term of this patent is extended or adjusted under 35 U.S.C. 154(b) by 57 days.

(21) Appl. No.: 12/003,164

(22) Filed: Dec. 20, 2007

(65) Prior Publication Data

US 2009/0116035 A1 May 7, 2009

(30) Foreign Application Priority Data

Nov. 2, 2007 (TW) .............. 96141277 A (51) Int. Cl.
*G01B 11/14* (2006.01)
*G01B 11/00* (2006.01)

(52) U.S. Cl. .................. 356/614; 356/399
(58) Field of Classification Search .......... 356/600–640
See application file for complete search history.

(56) References Cited

U.S. PATENT DOCUMENTS

| 4,200,395 | A | * | 4/1980 | Smith et al. | 356/509 |
|---|---|---|---|---|---|
| 4,211,489 | A | * | 7/1980 | Kleinknecht et al. | 356/400 |
| 4,340,305 | A | * | 7/1982 | Smith et al. | 356/509 |
| 4,600,309 | A | * | 7/1986 | Fay | 356/401 |
| 4,699,515 | A | * | 10/1987 | Tanimoto et al. | 356/401 |
| 5,243,195 | A | * | 9/1993 | Nishi | 250/548 |
| 6,088,103 | A | * | 7/2000 | Everett et al. | 356/503 |
| 6,487,307 | B1 | * | 11/2002 | Hennessey et al. | 382/149 |
| 6,504,611 | B2 | * | 1/2003 | Kogan et al. | 356/399 |
| 7,042,569 | B2 | * | 5/2006 | Sezginer et al. | 356/401 |
| 7,046,361 | B1 | * | 5/2006 | Yang et al. | 356/401 |
| 7,160,657 | B2 | | 1/2007 | Smith et al. | |
| 7,379,184 | B2 | * | 5/2008 | Smith et al. | 356/401 |
| 7,425,396 | B2 | * | 9/2008 | Gruss et al. | 430/22 |
| 2004/0208350 | A1 | * | 10/2004 | Rea et al. | 382/128 |
| 2006/0197951 | A1 | * | 9/2006 | Frommer et al. | 356/401 |

\* cited by examiner

*Primary Examiner*—Gregory J Toatley, Jr.
*Assistant Examiner*—Jarreas C. Underwood
(74) *Attorney, Agent, or Firm*—Birch, Stewart, Kolasch & Birch, LLP (57) ABSTRACT

A structure for overlay measurement is provided in the present invention, using the diffraction characteristics on the boundary portion between two microstructures formed on each of two material layers. The optical intensity distribution on the boundary portion between microstructures formed on the two overlaid material layers respectively are measured by an optical microscope to obtain the overlay error between the two overlaid material layers. In addition, the present invention also provides a method for overlay measurement using the structure for overlay measurement, wherein a merit relation based on the optical intensity distribution on the boundary portion between different microstructures is determined. The merit relation can be used to analyze the overlay error to improve the efficiency and accuracy of on-line error measurement.

11 Claims, 11 Drawing Sheets

STRUCTURE AND METHOD FOR OVERLAY MEASUREMENT

BACKGROUND OF THE INVENTION

1. Field of the Invention

The present invention generally relates to a structure and a method for overlay measurement and, more particularly, to a structure and a method for overlay measurement capable of analyzing material layers and the overlay error between the material layers.

2. Description of the Prior Art

In semiconductor manufacturing, overlay measurement is for determining the alignment between a printed layer and a previous printed layer. It is crucial to achieve precise and accurate alignment for every element so that the quality and performance device can be satisfactory. Since the critical dimension in semiconductor manufacturing decreases as years go by, it becomes harder to use the conventional optical microscope to determine the overlay error between overlaid layers. Therefore, it is very important for semiconductor manufacturing to efficiently and precisely measure the overlay error between two overlaid patterned layers.

Currently, overlay measurement is applied in determining optically determinable patterns that are printed on a semiconductor wafer during manufacturing. These patterns are in a bar-in-bar or box-in-box format. Conventionally, the patterns are magnified or digitalized to quantify the overlay error using image analysis algorithm to obtain the dislocation between two overlaid layers. U.S. Pat. No. 7,160,657 discloses the bar-in-bar and box-in-box related technologies.

In 1988, Chappelow et al. provides another method for overlay measurement, wherein linear grating patterns on each of the top and bottom layers are used. The linear grating patterns on the top and bottom layers have the same pitch. The point light source is much larger than the line width of the grating patterns. In 2001, Bischoff uses the diffraction efficiency difference of the $\pm 1^{st}$ order diffractions to measure the overlay error. The pattern used by Bischoff is obtained by overlaying the linear grating patterns with the same pitch on the two overlaid layers. Identical amplitudes for the $\pm 1^{st}$ order diffractions occur due to symmetry when the center of one grating pattern is overlapped with the center of another grating pattern. The symmetry breaks if there is any dislocation between the grating patterns. The amplitude difference of the $\pm 1^{st}$ order diffractions is related to the dislocation.

Recently, H. T. Huang, adopts similar grating structure as a target to perform zero-order diffraction for measurement. A wide-band light source is used to compare the diffraction efficiency resulting from zero-order diffraction to obtain overlay data. The aforementioned optical measurement technique based on diffraction analysis on a periodic pattern is diffraction measurement. The apparatus for diffraction measurement is referred to as a scatterometer. Better resolution can be achieved using diffraction characteristics of a grating pattern than general patterns. However, the aforementioned measurement takes a longer time than the use of an optical microscope. Therefore, a theoretical model is required to compare the measured data, as disclosed in U.S. Patent Pub. No. 20060197951.

SUMMARY OF THE INVENTION

It is one object of the present invention to provide to a structure for overlay measurement comprising a pair of microstructures on each of two material layers, wherein the dislocation between two pairs of microstructures is the overlay error to be measured. The characteristic spectrum of reflective light varies with the dislocation of overlaid patterns, and therefore the resolution of overlay measurement can be effectively improved by using diffraction characteristics on the boundary portion between two microstructures formed on each of two material layers.

It is another object of the present invention to provide to a method for overlay measurement capable using the diffraction characteristics on the boundary portion between two microstructures formed on each of two material layers. The optical intensity distribution on the boundary portion between microstructures formed on the two overlaid material layers respectively are measured by an optical microscope to analyze the overlay error between the two overlaid material layers and improve the resolution in overlay error measurement.

It is another object of the present invention to provide to a method for overlay measurement, wherein a merit relation based on the optical intensity distribution on the boundary portion between different microstructures is determined. The merit relation can be used to analyze the overlay error to improve the efficiency and accuracy of on-line error measurement.

In order to achieve the foregoing objects, in one embodiment, the present invention provides a structure for overlay measurement capable of determining an overlay error between two overlaid layers, the structure comprising: a material layer comprising a first microstructure and a second microstructure formed thereon, wherein there is an interval between the first microstructure and the second microstructure.

In another embodiment, the present invention provides a structure for overlay measurement capable of determining an overlay error between two overlaid layers, the structure comprising: a material layer comprising a first grating microstructure and a second grating microstructure formed thereon, wherein there is an interval between the first grating microstructure and the second grating microstructure.

In another embodiment, the present invention provides a method for overlay measurement, comprising steps of: (a) forming a pair of microstructures on each of a first material layer and a second material layer, wherein there is an interval between the pair of microstructures; (b) measuring an optical intensity distribution of an optical image corresponding to the pair of microstructures; (c) determining a merit value based on the optical intensity distribution; (d) changing the distance between the center of the interval on the first material layer and the center of the interval on the second material layer; and (e) repeating from step (a) to step (d) to obtain a merit relation based on the plurality of merit values resulting from step (a) to step (d).

In another embodiment, the present invention provides a method for overlay measurement, comprising steps of: determining a merit relation; forming a pair of microstructures on each of a first material layer under measurement and a second material layer under measurement, wherein there is an interval between the pair of microstructures; measuring an optical intensity distribution of an optical image corresponding to the pair of microstructures; determining a merit value based on the optical intensity distribution; and comparing the merit value to the merit relation to obtain an overlay error between the first material layer under measurement and the second material layer under measurement.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention can be exemplified but not limited by the preferred embodiment as described hereinafter.

Figure 1A:
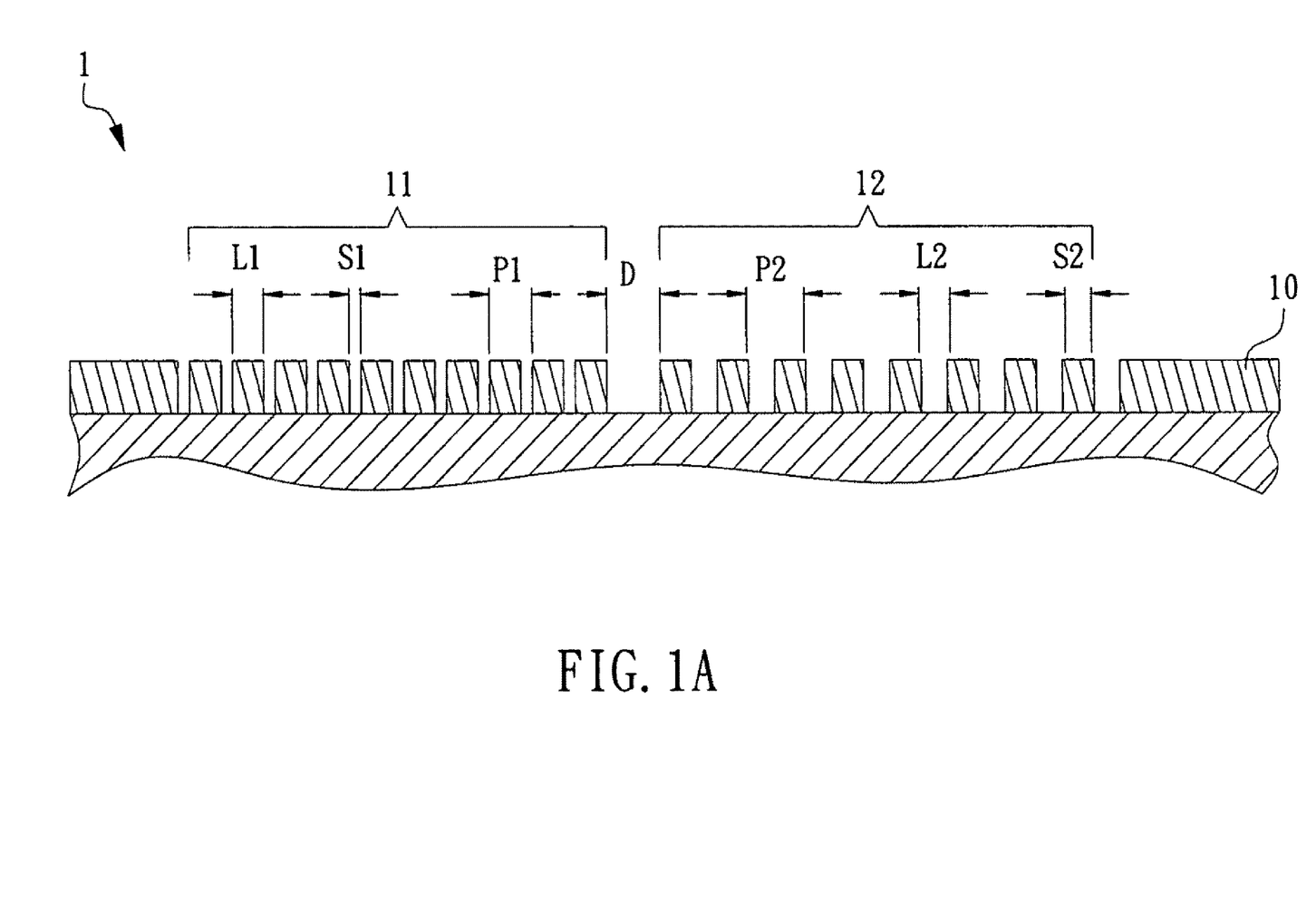
FIG. 1A is a schematic diagram showing a structure for overlay measurement according to one embodiment of the present invention.
Figure 1B:
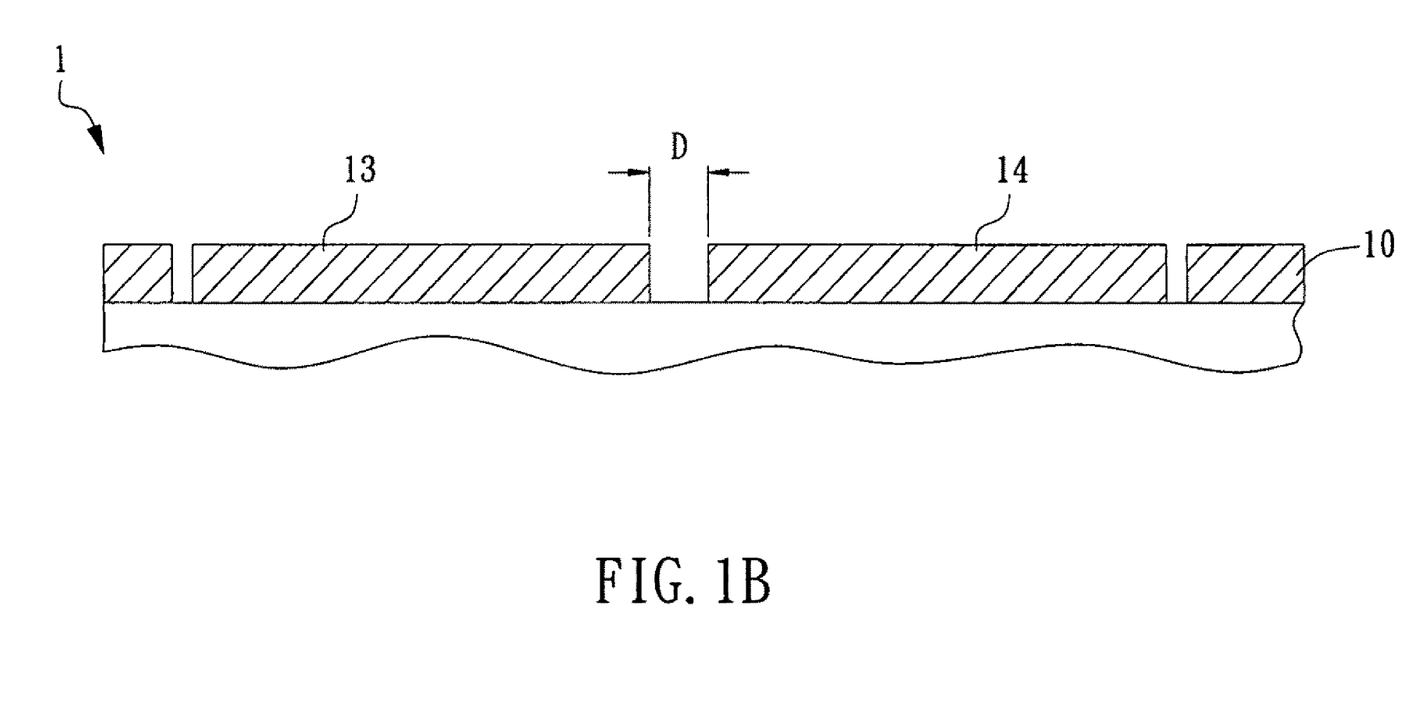
FIG. 1B is a schematic diagram showing a structure for overlay measurement according to another embodiment of the present invention.

Please refer to FIG. 1A, which is a schematic diagram showing a structure for overlay measurement according to one embodiment of the present invention. The structure for overlay measurement is used for measuring the overlay error between two overlaid material layers. The structure 1 comprises a material layer 10 comprising a first microstructure 11 and a second microstructure 12 formed thereon. There is an interval D between the first microstructure 11 and the second microstructure 12. In the present embodiment, the first microstructure 11 and the second microstructure 12 are grating microstructures. In FIG. 1A, the first microstructure 11 and the second microstructure 12 have different pitches P1 and P2. The line width and spacing of the first microstructure 11 are L1 and S1, respectively; and the line width and spacing of the first microstructure 12 are L2 and S2, respectively. The pitches, line widths and spacings of the first microstructure 11 and the second microstructure 12 are identical or non-identical. Moreover, the microstructures can be bulk structures 13 and 14 with an interval D therebetween as shown in FIG. 1B.

The structure for overlay measurement is used for measuring the overlay error. Please refer to FIG. 2, which is a flow-chart of a method for overlay measurement according to the present invention. In the present embodiment, the method 2 comprises a step 20 of determining a merit relation. The merit relation is linear or an $n^{th}$ order curve. Please refer to FIG. 3A, which a flow-chart of a step of determining a merit relation according to the present invention. The step of determining the merit relation comprises a step 201 of forming a pair of microstructures on each of a first material layer and a second material layer, wherein there is an interval between the pair of microstructures. The pair of microstructures can be the structures shown in FIG. 1A and FIG. 1B. The first material layer and the second material layer can be overlaid. Furthermore, there is a material interposed therebetween.

Figure 4:
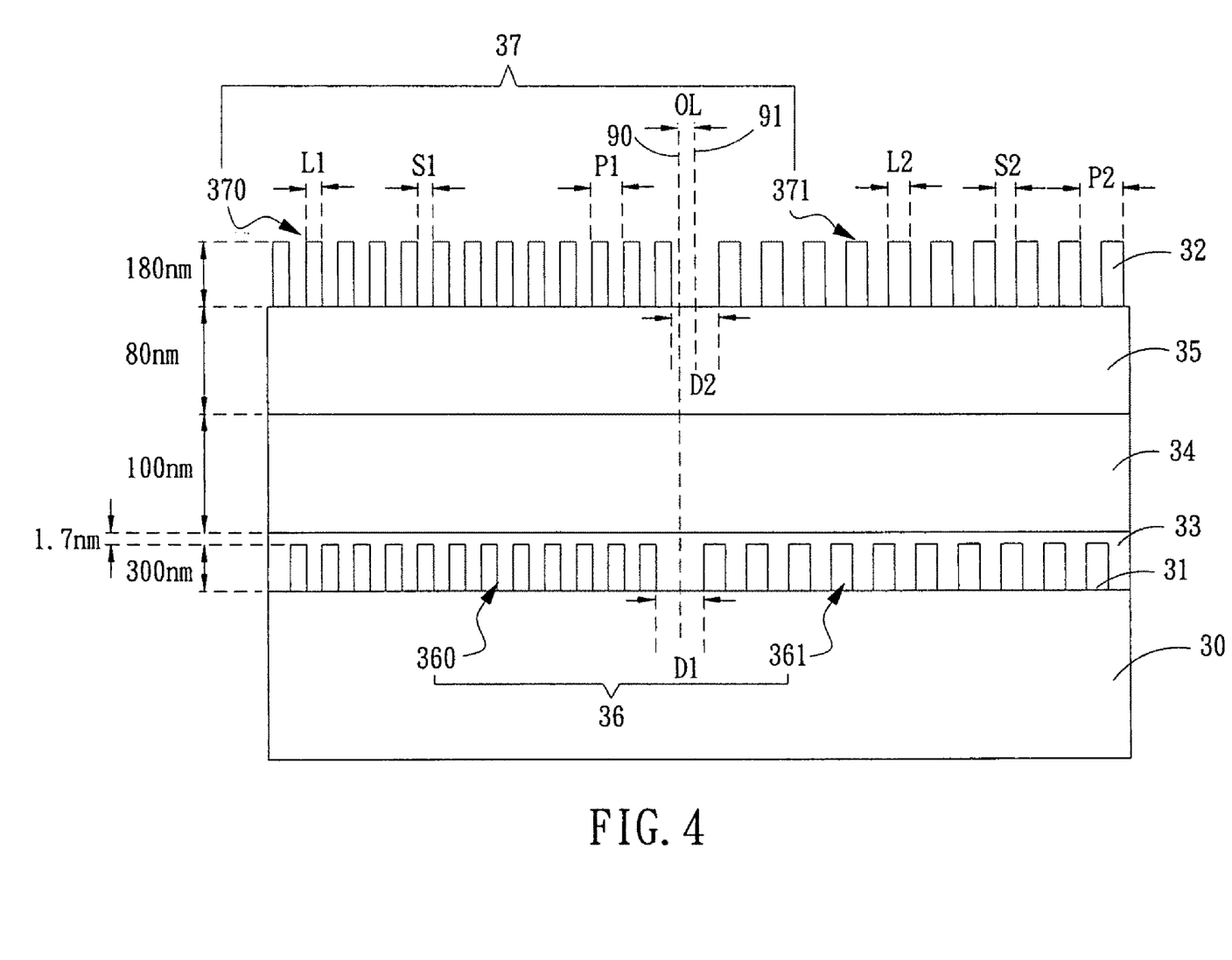
FIG. 4 is a schematic diagram showing a first material layer overlaid with a second material layer.

Please refer to FIG. 4, which is a schematic diagram showing a first material layer overlaid with a second material layer. In FIG. 4, the substrate 30 is silicon. The pair of microstructures 36 on the first material layer 31 is silicon with a thickness of 300 nm. The pair of microstructures 37 on the second material layer 32 is photo-resist with a thickness of 180 nm. The number of layers between the first material layer 31 and the second material layer 32 is three. The three layers are a silicon dioxide ($SiO_2$) layer 33, a poly-silicon layer 34, and an anti-reflective coating layer 35 with a thickness of 80 nm, 100 nm, and 1.7 nm, respectively. In grating design, P1 is 400 nm, L1 is 200 nm, S1 is 200 nm; and P2 is 700 nm, L2 is 350 nm, S2 is 350 nm. There is a dislocation OL between the center in the interval D1 on the first material layer 31 and the center in the interval D2 on the second material layer 32. The optical intensity distribution on the boundary portion of the overlaid microstructures depends on the dislocation OL. In the present embodiment, the grating characteristics of the microstructure 360 on the first material layer 31 are similar to those of the microstructure 370 on the second material layer 32; and the grating characteristics of the microstructure 361 on the first material layer 31 are similar to those of the microstructure 371 on the second material layer 32. Moreover, even though the present embodiment is exemplified using semiconductor processing; however, the present invention can also be applied in processing using thin-film deposition such as TFT-LCD manufacturing.

Figure 5:
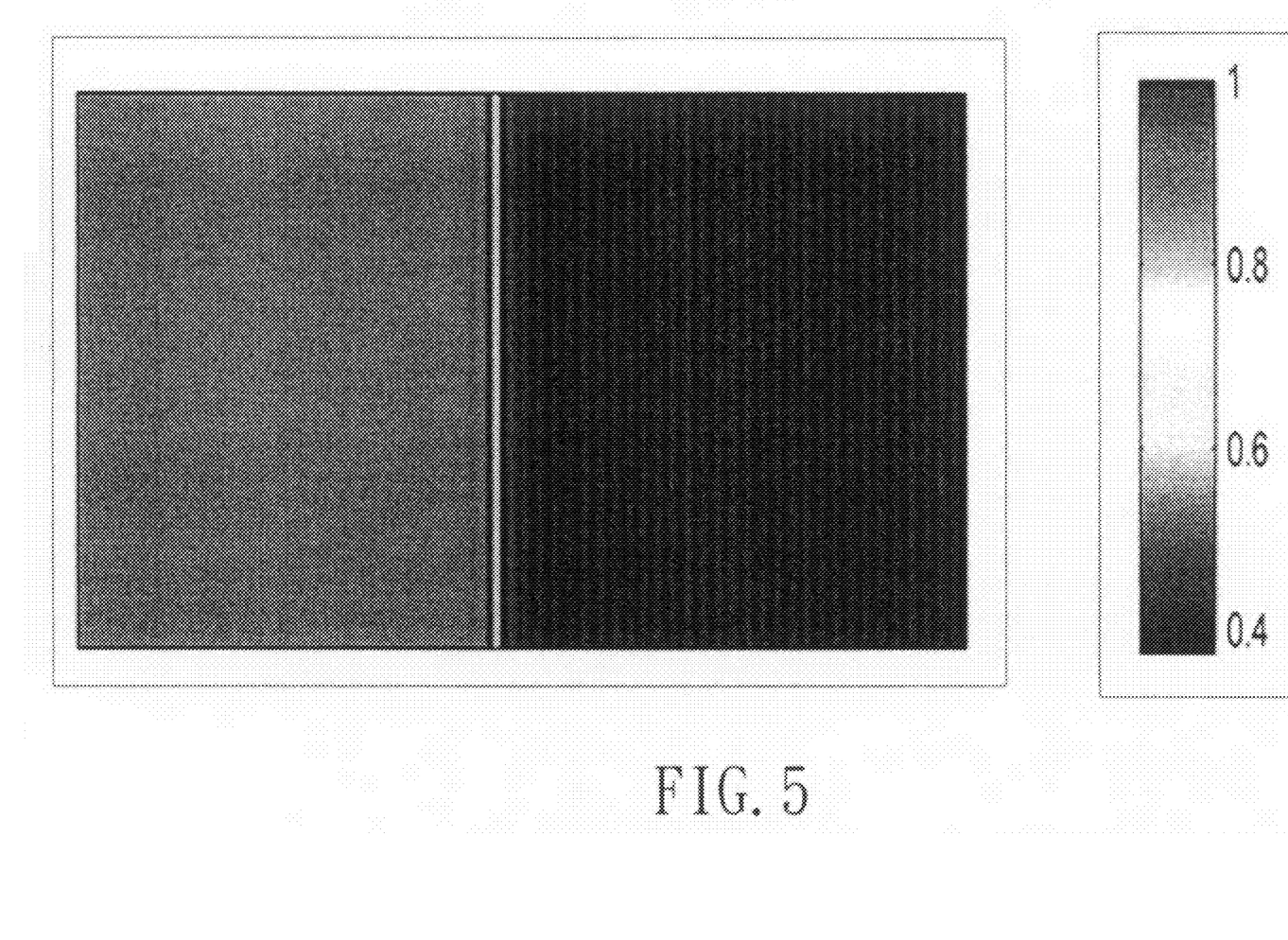
FIG. 5 is an optical image of two pairs of overlaid microstructures with a dislocation of 50 nm according to the present invention.
Figure 6:
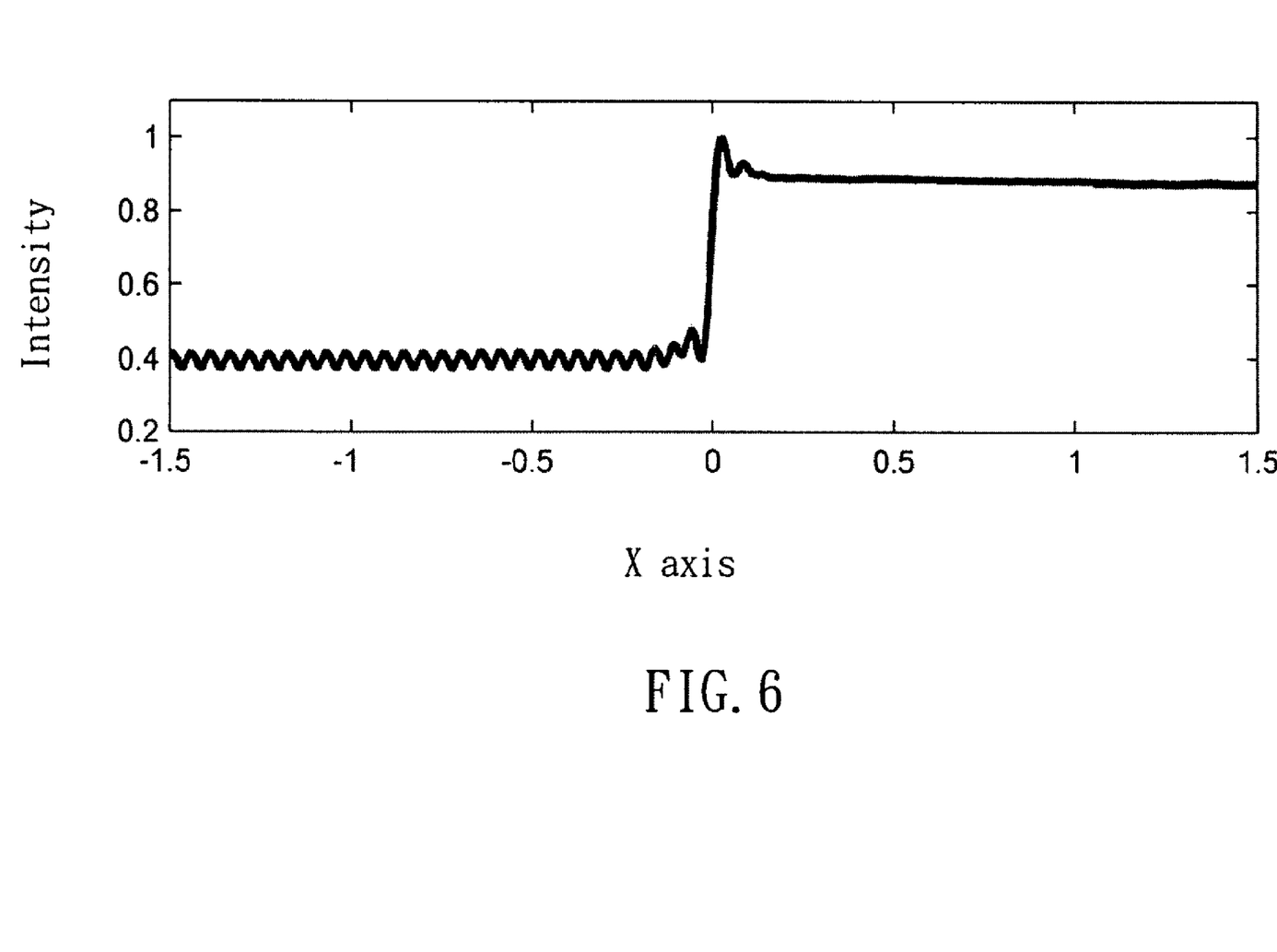
FIG. 6 shows the optical intensity distribution corresponding to a first pair of overlaid microstructures and a second pair of overlaid microstructures.

Returning to FIG. 3A, in Step 202, an optical image corresponding to the pair of microstructures on each of the first material layer and the second material layer is acquired. Since there is a dislocation OL between the first material layer and the second material layer, the optical intensity distribution is as shown in FIG. 5, which is an optical image of two pairs of overlaid microstructures with a dislocation of 50 nm according to the present invention. In Step 203, an optical intensity distribution of an optical image corresponding to the pair of microstructures is measured. Please refer to FIG. 6, which shows the optical intensity distribution corresponding to a first pair of overlaid microstructures and a second pair of overlaid microstructures. In FIG. 6, it shows that the optical intensity varies obviously on the boundary portion.

Figure 3A:
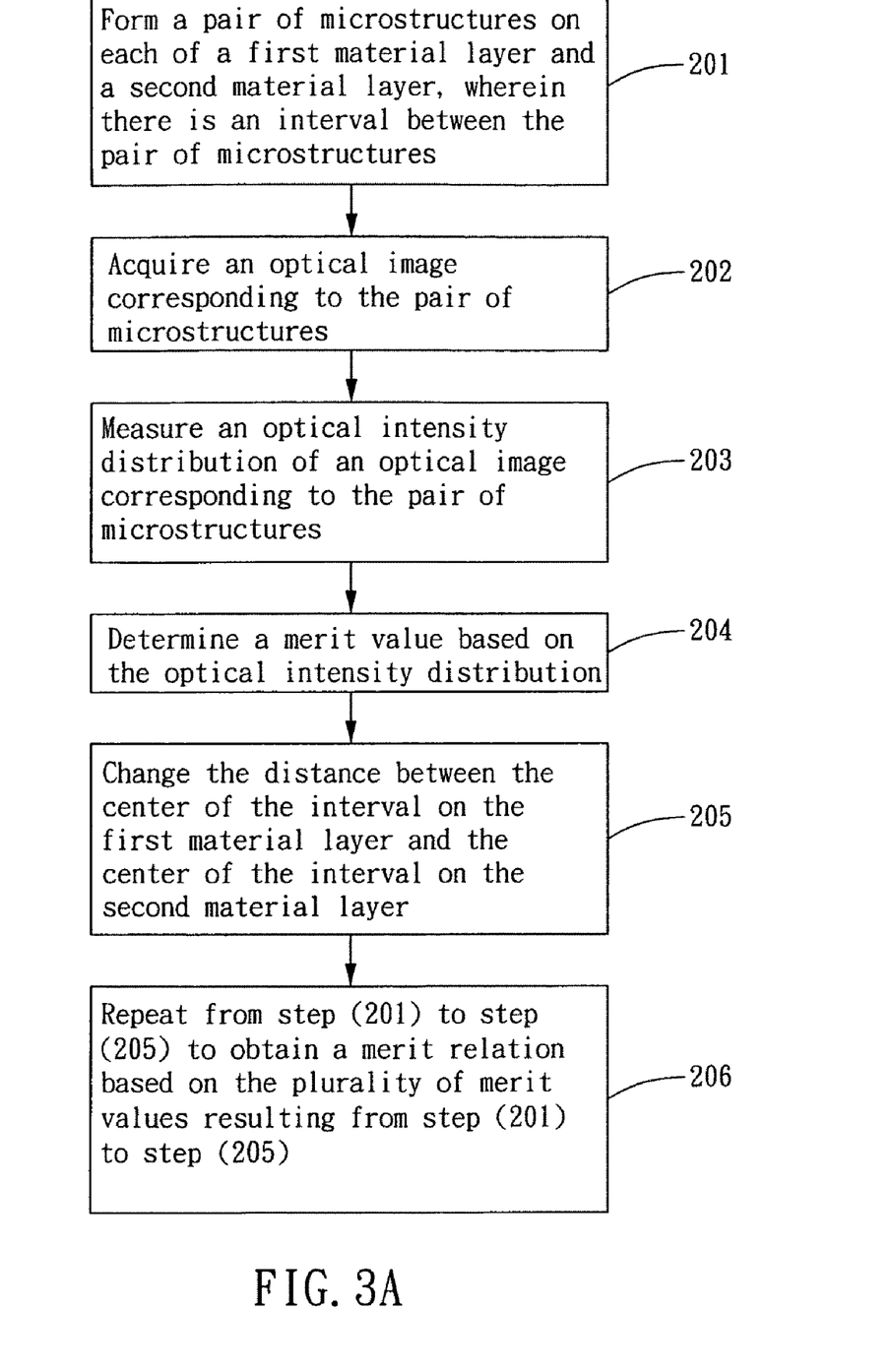
FIG. 3A a flow-chart of a step of determining a merit relation according to the present invention.
Figure 3B:
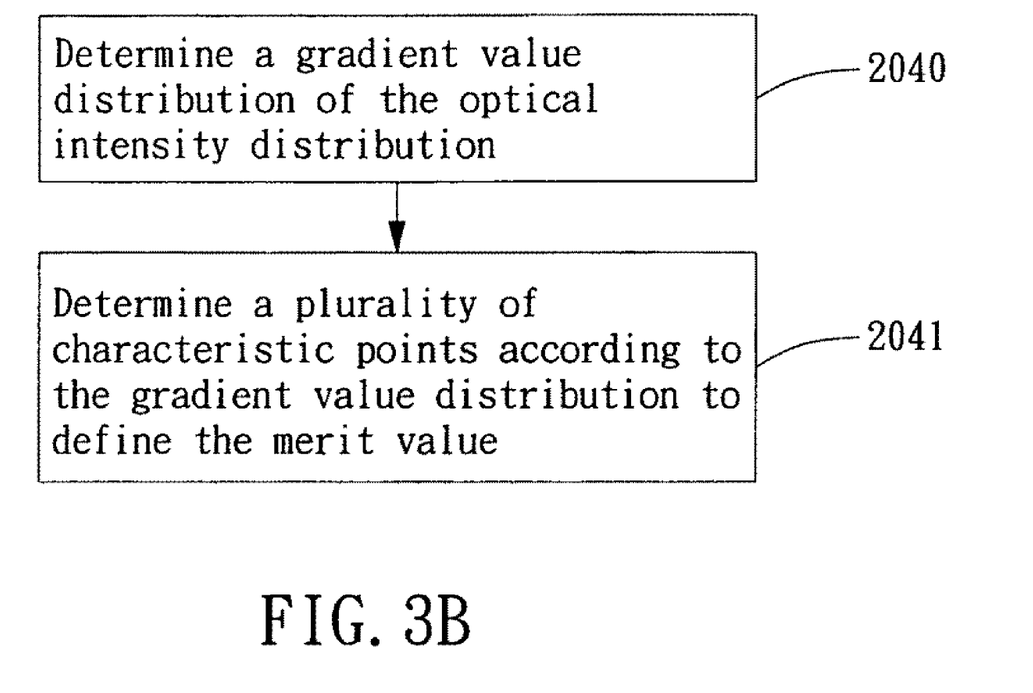
FIG. 3B a flow-chart of a step of determining merit values according to the present invention.
Figure 7:
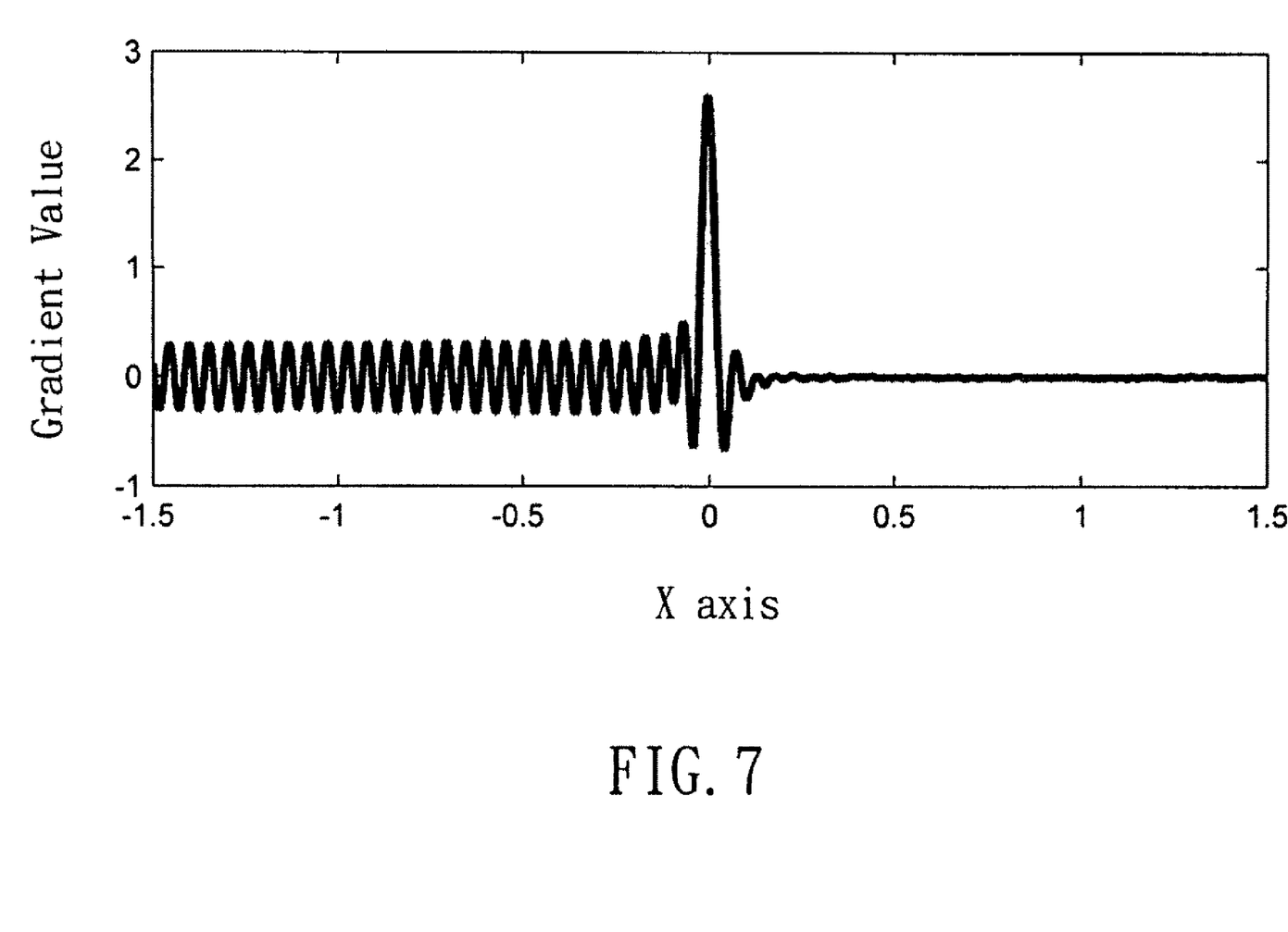
FIG. 7 shows the gradient value of the optical intensity distribution in FIG. 6.
Figure 8:
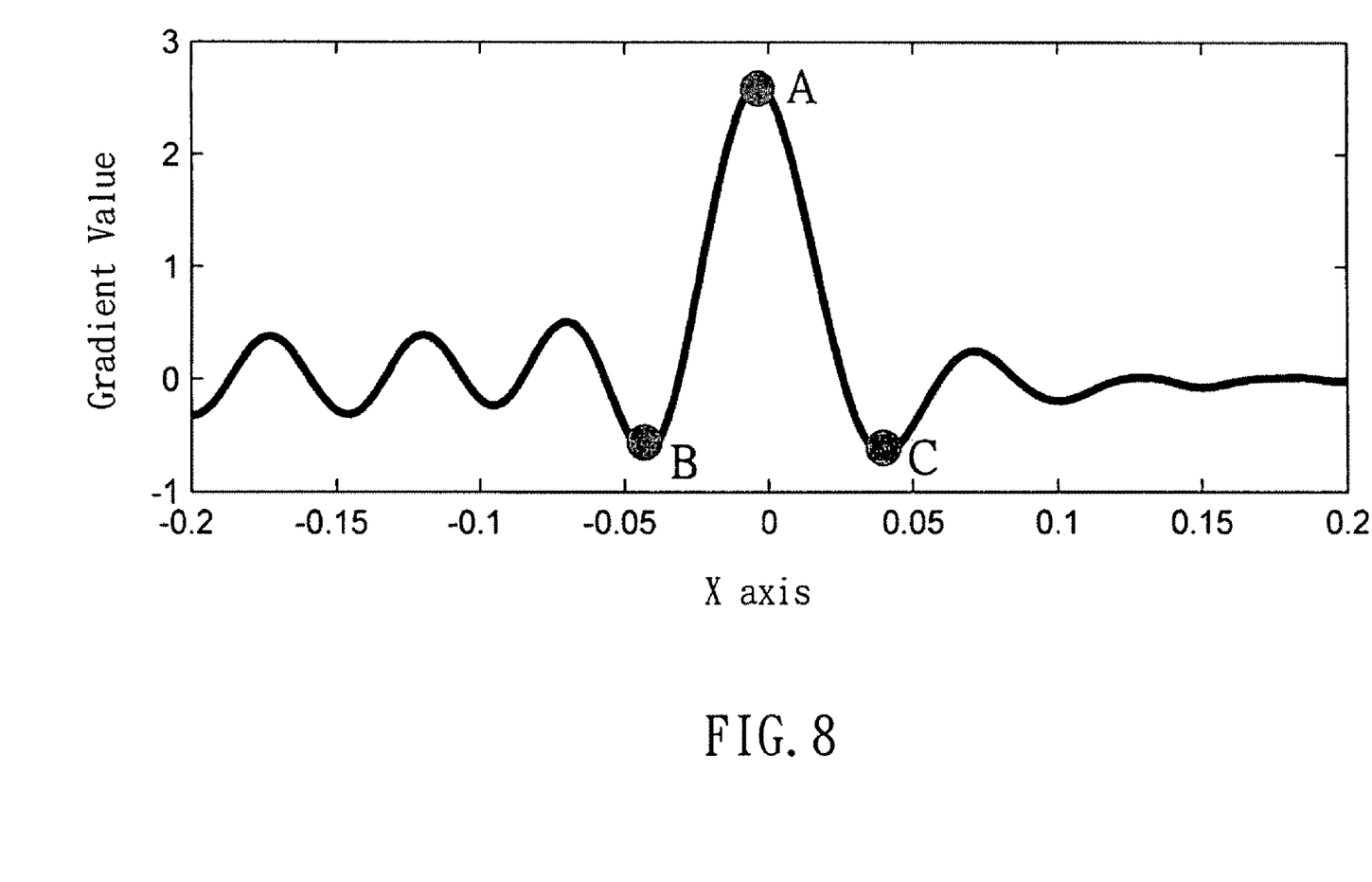
FIG. 8 shows the gradient value of the optical intensity distribution on the interval portion.

In Step 204, a merit value based on the optical intensity distribution in FIG. 6 is determined. Please refer to FIG. 3B, which is a flow-chart of a step of determining merit values according to the present invention. First, in Step 2040, a gradient value distribution of the optical intensity distribution is determined, as shown in FIG. 7. The object of Step 2040 is to emphasize the variation in optical intensity on the interval portion. In Step 2041, a plurality of characteristic points according to the gradient value distribution to define the merit value are determined. In order to illustrate the characteristic points, please refer to FIG. 8, which shows the gradient value of the optical intensity distribution on the interval portion. Three characteristic points A, B and C indicate the peak point and the valley points on both sides of the peak point according to the gradient value distribution. The merit value can be calculated using the intensities at A, B and C according to the equation (1). However, other equations can also be used according to the user's requirements. Based on the characteristic points A, B and C for example, the merit value for the two pairs of overlaid microstructures with a dislocation of 50 nm is 3.9.

$$\text{Merit Value} = |A - (B + C)| \quad (1)$$

Figure 9:
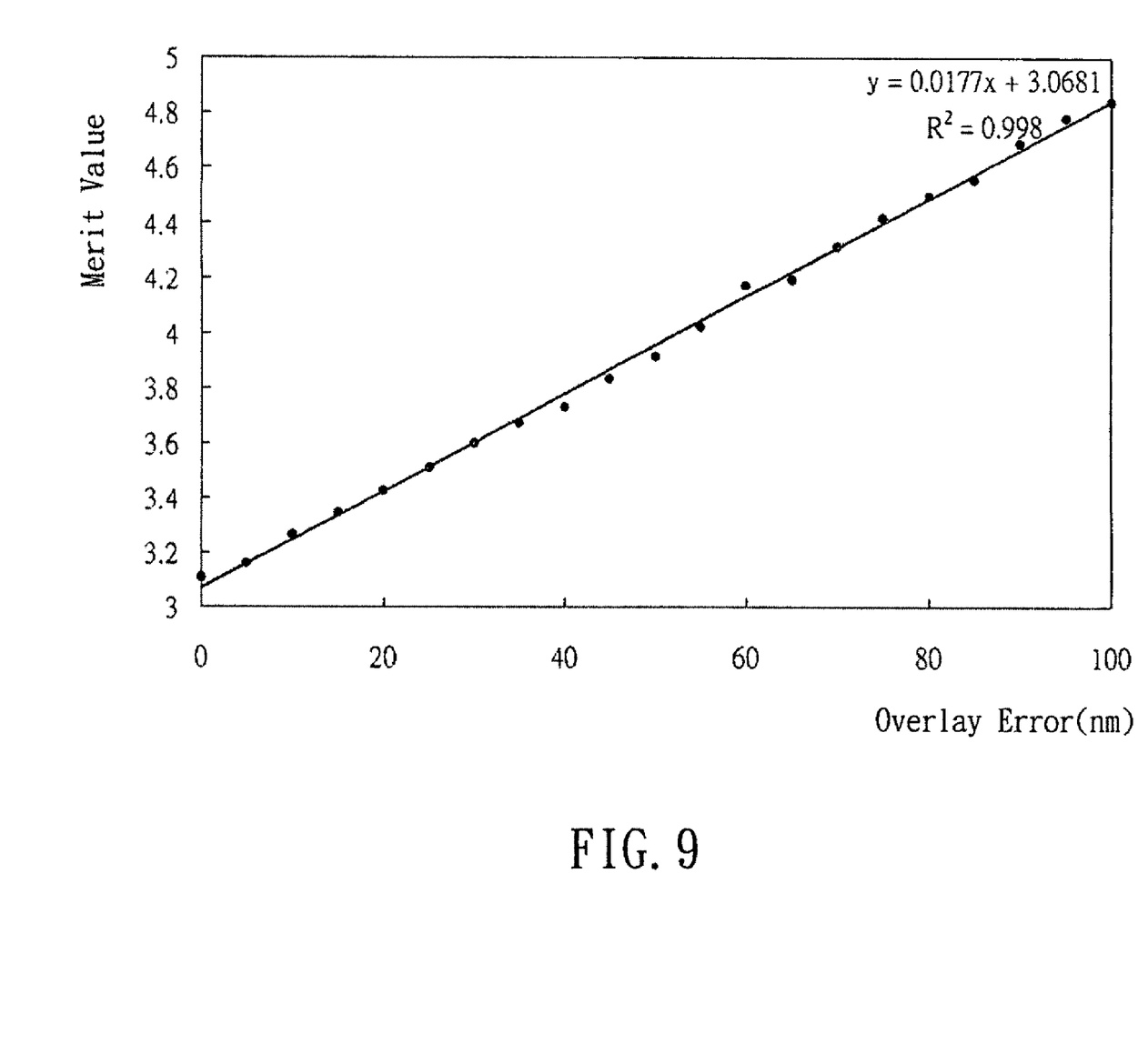
FIG. 9 shows the merit relation based on the dislocation and the merit values.

After the merit value is calculated, in Step 205, the distance between the center of the interval on the first material layer and the center of the interval on the second material layer is changed to change the dislocation OL. In Step 206, step (201) to step (205) is repeated to obtain a merit relation based on the plurality of merit values resulting from step (201) to step (205). In the present embodiment, the dislocation OL in Step 205 is within the range of 0 nm to 100 nm. In other words, after repeating from step (201) to step (205), the plurality of merit values corresponding to different dislocations OL within the range of 0 nm to 100 nm can be calculated. The merit relation is then analyzed using numerical analysis. FIG. 9 shows the merit relation based on the dislocation and the merit values. In FIG. 9, it is found that better sensitivity can be achieved when the dislocation is 5 nm. The merit relation is linear and the merit value can be obtained by deciding the overlay error. Moreover, the merit relation can also be an $n^{th}$ order curve.

Figure 2:
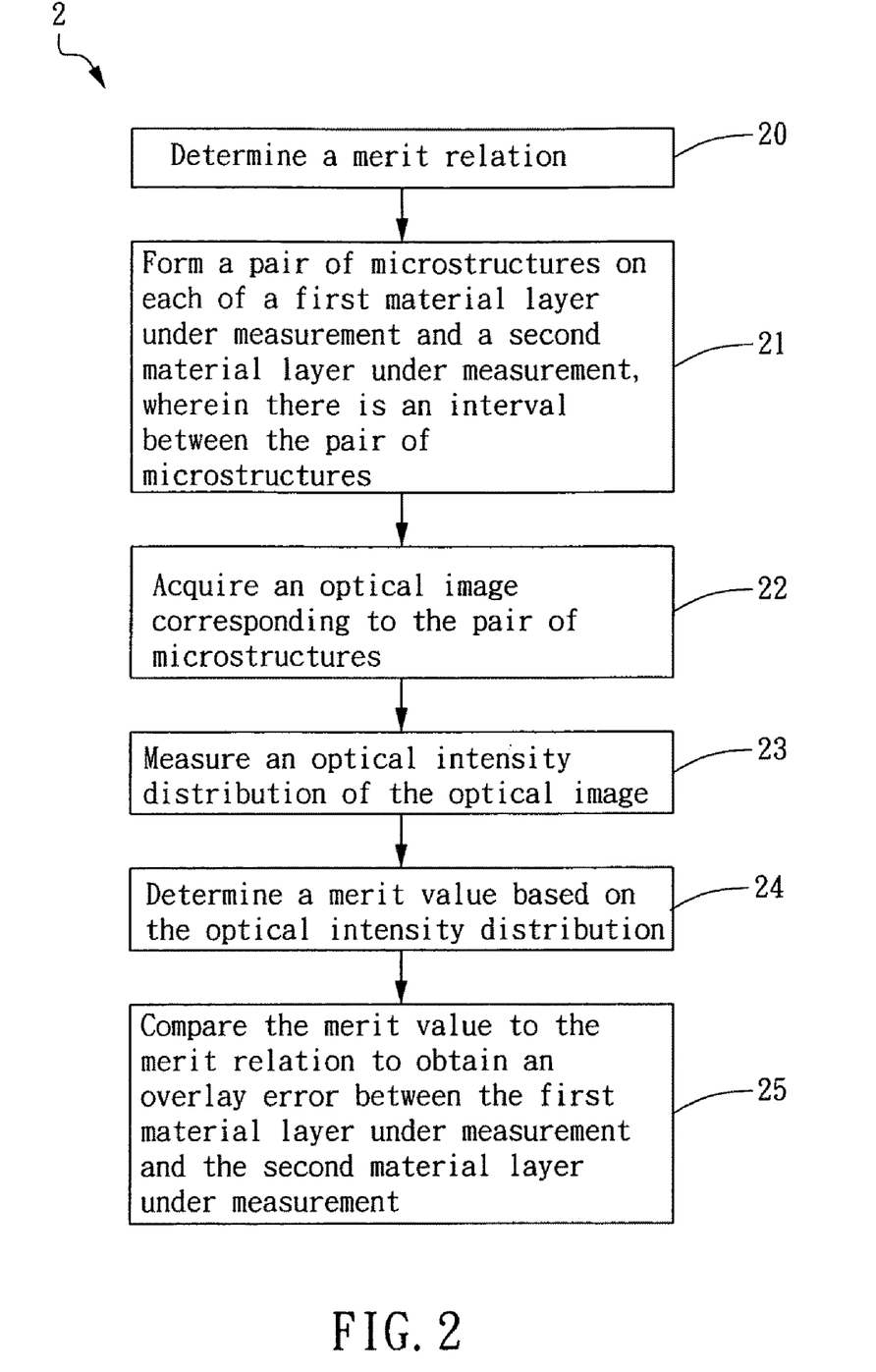
FIG. 2 is a flow-chart of a method for overlay measurement according to the present invention.

Referring to FIG. 2, the overlay error can be measured after the merit relation is determined. In Step 21, a pair of microstructures are formed on each of a first material layer under measurement and a second material layer under measurement, wherein there is an interval between the pair of microstructures. The first material layer under measurement and the second material layer under measurement are any material layer under measurement during manufacturing. Then in Step 22, an optical image corresponding to the pair of microstructures is acquired. In Step 23, an optical intensity distribution of the optical image is measured. Then in Step 24, a merit value based on the optical intensity distribution is determined. The Steps 22 to 24 are similar to the Steps 203 to 204, and thus description thereof is not repeated.

In Step 25, the merit value is compared to the merit relationship to obtain an overlay error between the first material layer under measurement and the second material layer under measurement. For example, in FIG. 9, the overlay error is 60 nm if the merit value is 4.2 after repeating Step 22 to Step 24. It indicates that the dislocation between the first material layer under measurement and the second material layer under measurement is 60 nm. By using the steps in FIG. 2, the overlay error between overlaid layers during semiconductor or TFT-LCD manufacturing is measured so as to improve the efficiency and accuracy of on-line error measurement.

According to the above discussion, it is apparent that the present invention discloses a structure and a method for overlay measurement capable of improving efficiency and accuracy of overlay measurement. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for overlay measurement, comprising steps of:
   (a) forming a material layer comprising a first grating structure and a second grating structure being overlaid with each other and having with different periods, wherein there is an interval gap in each of the first grating structure and the second grating structure;
   (b) measuring an optical intensity distribution of an optical image around the interval of the material layer;
   (c) determining a merit value based on the optical intensity distribution;
   (d) changing the distance between the center of the interval on the first grating structure and the center of the interval on the second grating structure; and
   (e) repeating from step (a) to step (d) to obtain a merit relation based on the plurality of merit values resulting from step (a) to step (d).

2. The method for overlay measurement as recited in claim 1, wherein the step (c) further comprises steps of:
   (c1) determining a gradient value distribution of the optical intensity distribution; and
   (c2) determining a plurality of characteristic points according to the gradient value distribution to define the merit value.

3. The method for overlay measurement as recited in claim 2, wherein the plurality of characteristic points are the peak point and the valley points on both sides of the peak point according to the gradient value distribution.

4. The method for overlay measurement as recited in claim 2, wherein the pitches of the first grating structure and the second grating structure are different.

5. The method for overlay measurement as recited in claim 2, wherein the line widths of the first grating structure and the second grating structure are different.

6. A method for overlay measurement, comprising steps of:
   determining a merit relation;
      wherein determining a merit relation further comprises steps of
      (a) forming a material and a second material layer comprising a first grating structure and a second grating structure being overlaid with each other and having with different periods, wherein there is an interval gap in each of the first grating structure and the second grating structure;
      (b) measuring an optical intensity distribution of an optical image around the interval of the material layer;
      (c) determining a merit value based on the optical intensity distribution;
      (d) changing the distance between the center of the interval on the grating structure and the center of the interval on the grating structure; and
      (e) repeating from step (a) to step (d) to obtain a merit relation based on the plurality of merit values resulting from step (a) to step (d;
   forming a material layer comprising a first grating structure and a second grating structure being overlaid with each other and having with different periods, wherein there is an interval gap in each of the first grating structure and the second grating structure;
   measuring an optical intensity distribution of an optical image around the interval of the material layer;
   determining a merit value based on the optical intensity distribution; and
   comparing the merit value to the merit relation to obtain an overlay error between the first grating structure and the second grating structure.

7. The method for overlay measurement as recited in claim 6, wherein the step of determining a merit value further comprises steps of:
   determining a gradient value distribution of the optical intensity distribution; and
   determining a plurality of characteristic points according to the gradient value distribution to define the merit value.

8. The method for overlay measurement as recited in claim 7, wherein the plurality of characteristic points are the peak point and the valley points on both sides of the peak point according to the gradient value distribution.

9. The method for overlay measurement as recited in claim 6, wherein the pitches of the first grating structure and the second grating structure are different.

10. The method for overlay measurement as recited in claim 6, wherein the line widths of the first grating structure and the second grating structure are different.

11. The method for overlay measurement as recited in claim 6, wherein the step (c) further comprises steps of:
  (c1) determining a gradient value distribution of the optical intensity distribution; and
  (c2) determining a plurality of characteristic points according to the gradient value distribution to define the merit value.

\* \* \* \* \*